(12) United States Patent
Lee et al.

(10) Patent No.: US 8,159,012 B2
(45) Date of Patent: Apr. 17, 2012

(54) SEMICONDUCTOR DEVICE INCLUDING INSULATING LAYER OF CUBIC SYSTEM OR TETRAGONAL SYSTEM

(75) Inventors: Jong-cheol Lee, Seoul (KR); Jun-noh Lee, Gyeonggi-do (KR); Ki-vin Im, Gyeonggi-do (KR); Ki-yeon Park, Seoul (KR); Sung-hae Lee, Gyeonggi-do (KR); Sang-yeol Kang, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 218 days.

(21) Appl. No.: 12/238,822

(22) Filed: Sep. 26, 2008

(65) Prior Publication Data

US 2009/0085160 A1    Apr. 2, 2009

(30) Foreign Application Priority Data

Sep. 28, 2007 (KR) .................. 10-2007-0098402
Aug. 26, 2008 (KR) .................. 10-2008-0083516

(51) Int. Cl.
*H01L 27/108* (2006.01)
(52) U.S. Cl. ........ 257/296; 257/298; 257/300; 257/303; 257/306
(58) Field of Classification Search .............. 257/296, 257/298, 300, 303, 306
See application file for complete search history.

(56) References Cited

U.S. PATENT DOCUMENTS

2005/0145918 A1\* 7/2005 Gealy et al. .................. 257/306
2005/0152094 A1\* 7/2005 Jeong et al. .................. 361/312

FOREIGN PATENT DOCUMENTS

| KR | 100716654 B1 | 5/2007 |
| KR | 100716655 81 | 5/2007 |
| KR | 1020070111640 A | 11/2007 |

\* cited by examiner

*Primary Examiner* — Tan N Tran
(74) *Attorney, Agent, or Firm* — Myers Bigel Sibley & Sajovec

(57) ABSTRACT

Provided is a semiconductor device including an insulating layer of a cubic system or a tetragonal system, having good electrical characteristics. The semiconductor device includes a semiconductor substrate including an active region, a transistor that is formed in the active region of the semiconductor substrate, an interlevel insulating layer that is formed on the semiconductor substrate and a contact plug that is formed in the interlevel insulating layer and that is electrically connected to the transistor. The semiconductor device may include a lower electrode that is formed on the interlevel insulating layer and that is electrically connected to the contact plug, an upper electrode that is formed on the lower electrode and an insulating layer of a cubic system or a tetragonal system including a metal silicate layer. The insulating layer may be formed between the lower electrode and the upper electrode.

8 Claims, 15 Drawing Sheets

SEMICONDUCTOR DEVICE INCLUDING INSULATING LAYER OF CUBIC SYSTEM OR TETRAGONAL SYSTEM

CROSS-REFERENCE TO RELATED APPLICATIONS

This U.S. non-provisional patent application claims priority under 35 U.S.C. §119 of Korean Patent Application Nos. 10-2007-0098402 and 10-2008-0083516, filed on Sep. 28, 2007 and Aug. 26, 2008, respectively, in the Korean Intellectual Property Office, the disclosures of which are incorporated herein in their entirety by reference.

BACKGROUND

The inventive concept relates to semiconductor devices, and more particularly, to semiconductor devices including an insulating layer.

Recently, in accordance with the development of semiconductor technologies and the needs of consumers, electronic devices may have higher integration densities and improved performance. In this regard, there may be a need to increase the integration densities and improve the performance of semiconductor devices that are the main components of such electronic devices. In particular, some insulating layer materials used in manufacturing conventional semiconductor devices may not meet permittivity and/or insulation objectives.

SUMMARY

Some embodiments of the present invention include a semiconductor device including an insulating layer. Some embodiments of such a semiconductor device may include a semiconductor substrate including an active region, a transistor that is formed in the active region of the semiconductor substrate, and an interlevel insulating layer that is formed on the semiconductor substrate. The semiconductor device may include a contact plug that is formed in the interlevel insulating layer and that is electrically connected to the transistor, a lower electrode that is formed on the interlevel insulating layer and that is electrically connected to the contact plug and an upper electrode that is formed on the lower electrode. An insulating layer of a cubic system or a tetragonal system that includes a metal silicate layer may be formed between the lower electrode and the upper electrode.

In some embodiments, the metal silicate layer includes a hafnium atom a zirconium atom, or both a hafnium atom and a zirconium atom. Some embodiments provide that the metal silicate layer includes a hafnium atom and the insulating layer of the cubic system or the tetragonal system further includes a zirconium-based oxide layer. In some embodiments, the zirconium-based oxide layer includes a first zirconium-based oxide layer and a second zirconium-based oxide layer and the metal silicate layer is formed between the first zirconium-based oxide layer and the second zirconium-based oxide layer.

Some embodiments provide that the metal silicate layer includes a first hafnium silicate layer and a second hafnium silicate layer and the zirconium-based oxide layer is formed between the first hafnium silicate layer and the second hafnium silicate layer. In some embodiments, the insulating layer of the cubic system or the tetragonal system provides that the metal silicate layer and the zirconium-based oxide layer that are sequentially and alternately formed in at least two cycles.

In some embodiments, the insulating layer of the cubic system or the tetragonal system includes the zirconium-based oxide layer and the metal silicate layer that are sequentially and alternately formed in at least two cycles. Some embodiments provide that the zirconium-based oxide layer includes a zirconium oxide layer or a zirconium silicate layer. In some embodiments, the metal silicate layer includes a first hafnium silicate layer including a first silicon concentration and a second hafnium silicate layer including a second silicon concentration that is greater than the first silicon concentration. Some embodiments provide that the metal silicate layer has a silicon concentration in the range of 1 to 10% and the silicon concentration includes a ratio of silicon atoms with respect to the sum of metal atoms and silicon atoms.

Some other embodiments of the present invention are directed to a semiconductor device that includes a semiconductor substrate, an electrode layer formed on the semiconductor substrate and a blocking oxide layer including an insulating layer of a cubic system or a tetragonal system, the blocking oxide layer formed between the semiconductor substrate and the electrode layer, and the insulating layer of the cubic system or the tetragonal system including a metal silicate layer.

In some embodiments, the metal silicate layer includes a hafnium atom, a zirconium atom or both a hafnium atom and a zirconium atom. Some embodiments provide that the insulating layer of the cubic system or the tetragonal system includes a multilayer insulating layer of a hafnium silicate layer and a zirconium-based oxide layer. In some embodiments, the insulating layer of the cubic system or the tetragonal system includes at least two hafnium silicate layers and the zirconium-based oxide layer is formed between two adjacent hafnium silicate layers of the at least two hafnium silicate layers.

In some embodiments, the insulating layer of the cubic system or the tetragonal system includes at least two zirconium-based oxide layers and the hafnium silicate layer is formed between two adjacent zirconium-based oxide layers of the at least two zirconium-based oxide layers. Some embodiments provide that the zirconium-based oxide layer includes a zirconium oxide layer or a zirconium silicate layer. In some embodiments, the blocking oxide layer further includes a silicon oxide layer disposed between the insulating layer of the cubic system or the tetragonal system and the semiconductor substrate.

Some embodiments provide that the blocking oxide layer further includes a silicon oxide layer disposed between the insulating layer of the cubic system or the tetragonal system and the electrode layer. In some embodiments, the blocking oxide layer further includes an aluminum oxide layer, a zirconium oxide layer, an aluminum silicate layer and/or a hafnium oxide layer. Some embodiments provide that the metal silicate layer includes a silicon concentration in the range of 8 to 35% and the silicon concentration includes a ratio of silicon atoms with respect to the sum of metal atoms and silicon atoms.

BRIEF DESCRIPTION OF THE DRAWINGS

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF THE EMBODIMENTS

Figure 1:
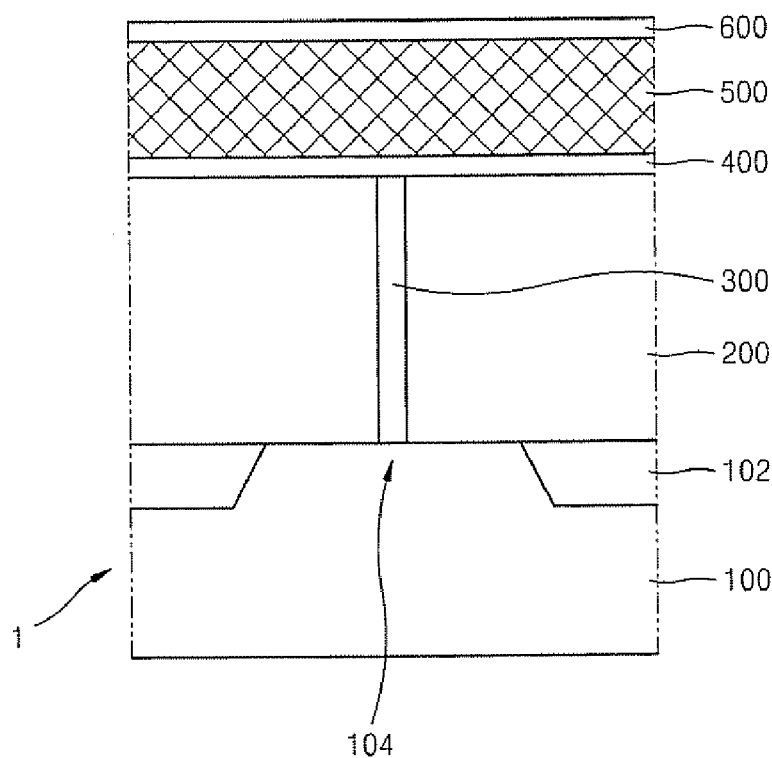
FIGS. 1, 4, 5, 20 and 21 are cross-sectional views of a semiconductor device including an insulating layer of a cubic system or a tetragonal system, according to some embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present invention. In addition, as used herein, the singular forms "a", "an" and "the" are intended to include the plural forms as well, unless the context clearly indicates otherwise. It also will be understood that, as used herein, the term "comprising" or "comprises" is open-ended, and includes one or more stated elements, steps and/or functions without precluding one or more unstated elements, steps and/or functions. The term "and/or" includes any and all combinations of one or more of the associated listed items.

It will also be understood that when an element is referred to as being "connected" to another element, it can be directly connected to the other element or intervening elements may be present. In contrast, when an element is referred to as being "directly connected" to another element, there are no intervening elements present. It will also be understood that the sizes and relative orientations of the illustrated elements are not shown to scale, and in some instances they have been exaggerated for purposes of explanation. Like numbers refer to like elements throughout.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art.

It should be construed that forgoing general illustrations and following detailed descriptions are exemplified and an additional explanation of claimed inventions is provided.

Reference numerals are indicated in detail in some embodiments of the present invention, and their examples are represented in reference drawings. Throughout the drawings, like reference numerals are used for referring to the same or similar elements in the description and drawings.

Reference is now made to FIG. 1, which is a cross-sectional view of a semiconductor device 1 including an insulating layer 500 of a cubic system or a tetragonal system, according to some embodiments of the present invention. The semiconductor device 1 includes the insulating layer 500 of the cubic system or tetragonal system, which may be formed on a semiconductor substrate 100 to be used as a dielectric layer of a capacitor. For example, the semiconductor substrate 100 may be formed of a semiconductor material such as silicon, among others. An impurities injection region (not shown) such as, for example, a well for forming a semiconductor device (e.g., a transistor), may be formed in the semiconductor substrate 100. Some embodiments provide that a device separation layer 102 may be formed on the semiconductor substrate 100. The device separation layer 102 may include, for example, silicon oxide, among others. Some embodiments provide that an active region 104 isolated by the device separation layer 102 may be formed on the semiconductor substrate 100. A source region (not shown) and a drain region (not shown), which may be used for forming a transistor (not shown), may be formed on the active region 104. An interlevel insulating layer 200 may be formed on a part of the semiconductor substrate 100, on which the active region 104 is formed. The interlevel insulating layer 200 may include gate insulating layers (not shown), gate lines (not shown) and/or bit lines (not shown), and may have a contact plug 300 connected to the transistor via the active region 104.

In some embodiments, the interlevel insulating layer 200 may be configured as a single layer. Some embodiments provide that the interlevel insulating layer 200 may be configured as a multilayer that is obtained by at least two deposition processes. For example, in some embodiments, the interlevel insulating layer 200 may include an insulating layer for separation between the gate lines, an insulating layer for separation between the bit lines, an insulating layer for separation between the gate line and the bit line, and/or an insulating layer covering the bit lines. Further, some embodiments provide that each of these insulating layers may be configured as a single layer, or may be configured as a multilayer that is obtained by at least two deposition processes. For example, the interlevel insulating layer 200 may include a silicon oxide layer, among others.

The contact plug 300 may be formed by etching the interlevel insulating layer 200 and then exposing the active region 104. Some embodiments provide that the contact plug 300 may be formed by stacking doped polysilicon and metal, or may be formed by using polysilicon. In some embodiments, when the interlevel insulating layer 200 is configured as a multilayer, the contact plug 300 may be formed in various steps. For example, the contact plug 300 may be formed in two steps including, for example, forming a landing pad connected to the transistor via the active region 104 by etching a part of the insulating layer for separation between the gate lines and forming an embedded plug connected to the landing pad by etching a part of the insulating layer for separation between the bit lines and a part of the insulating layer for separation between the gate line and the bit line. Some embodiments provide that the landing pad and the embedded plug may be formed by stacking doped polysilicon and metal, or may be formed by using polysilicon. In some embodiments, an additional plug connected to the embedded plug may be further formed.

Some embodiments provide that the gate line may be electrically insulated from the active region 104 by the gate insulating layer. In some embodiments, the gate line may be formed of doped polysilicon, tungsten W, tungsten silicide, and/or may be configured as a stack structure including at least one of the foregoing. Some embodiments provide that titanium Ti, and/or titanium nitride TiN, among others, may be further stacked. In addition, a capping pattern (not shown) may be formed on the gate line, and gate spacers (not shown) may be formed on both side surfaces of the gate line and capping pattern. Some embodiments provide that the gate insulating layer may be formed using a silicon oxide layer. In addition, some embodiments provide that the capping pattern and the gate spacer may be formed using a silicon nitride layer.

For example, the bit line may be formed so as to cross the gate line and may be insulated from the gate line by an insulating layer. Some embodiments provide that the bit line may be formed of doped polysilicon and/or may be formed by sequentially forming at least two materials selected from the group consisting of doped polysilicon, titanium Ti, titanium nitride TiN and/or tungsten W, among others. A bit line capping pattern (not shown) may be formed on the bit line, and bit line spacers (not shown) may be formed on both side surfaces of the bit line and bit line capping line.

In order to form a capacitor, a lower electrode 400 may formed so as to be connected to the contact plug 300. Some embodiments provide that the lower electrode 400 may be formed of a material that does not cause oxidization. In some embodiments, the lower electrode 400 may be formed of one selected from the group consisting of Ti, TiN, WN, Ta, TaN and/or TiAlN, among others.

Although the lower electrode 400 is illustrated in a flat board in FIG. 1, the invention is not limited thereto. That is, as long as a capacitor structure in which an insulating layer is formed between two electrodes is maintained, the invention may be applicable to a variety of structures.

A capacitor dielectric layer may be formed on the lower electrode 400. Some embodiments provide that the capacitor dielectric layer may be an insulating layer 500 (hereinafter, referred to as an "insulating layer 500 of the cubic system or tetragonal system") having crystallization of the cubic system or tetragonal system.

The insulating layer 500 of the cubic system or tetragonal system may be a metal silicate layer including a hafnium and/or zirconium atom. That is, some embodiments provide that the insulating layer 500 of the cubic system or tetragonal system may include, for example, hafnium silicate ($Hf_{x1}Si_{y1}O_{z1}$), zirconium silicate ($Zr_{x2}Si_{Y2}O_{z2}$) and/or hafnium-zirconium silicate ($(Hf,Zr)_{x3}Si_{y3}O_{z3}$), among others.

In addition, the insulating layer 500 of the cubic system or tetragonal system may be a metal silicate layer including a hafnium atom, that is, a multilayer including hafnium silicate or hafnium-zirconium silicate, and a zirconium-based oxide layer. The zirconium-based oxide layer may be, for example, a zirconium oxide ($ZrO_2$) layer or a zirconium silicate ($Zr_{x2}Si_{y2}O_{z2}$) layer.

Generally, a hafnium oxide layer in a bulk state may have a monoclinic system at room temperature, but a thin film hafnium oxide layer may have a monoclinic system including a small amount of the tetragonal system. Some embodiments provide that when the thin film hafnium oxide layer is annealed so that a hafnium atom (Hf) is substituted by a silicon atom (Si) so as to form hafnium silicate, silicon ($R_{Si}$=0.42 Å) having a smaller ion radius than that of hafnium ($R_{Hf}$=0.78 Å) causes compressive stress. In this manner, crystallization of the cubic system or tetragonal system may be obtained.

When hafnium silicate has crystallization of the cubic system or tetragonal system, a greater dielectric constant may be obtained compared to the case where hafnium silicate has crystallization of a monoclinic system. In addition, hafnium silicate may have a higher dielectric constant than hafnium oxide when hafnium silicate has crystallization of the cubic system or tetragonal system. In this regard, some embodiments provide that when a thin film hafnium oxide layer is to be used as a dielectric layer of the capacitor, some hafnium (Hf) atoms may be substituted by a silicon (Si) atom so as to form hafnium silicate of the cubic system or tetragonal system.

In some embodiments, a zirconium oxide layer itself may have crystallization of the cubic system or tetragonal system by low temperature annealing. However, when a silicon atom is added so as to form zirconium silicate, the density of zirconium silicate may be further increased relative to the zirconium oxide due to compressive stress.

Since the zirconium oxide layer may have crystallization of the cubic system or tetragonal system by relatively low temperature annealing, hafnium-zirconium silicate in which a zirconium atom is added to hafnium silicate may have crystallization of the cubic system or tetragonal system due to the zirconium atom using relatively low temperature annealing.

In the insulating layer 500 of the cubic system or tetragonal system, which may be formed of hafnium silicate of the cubic system or tetragonal system, zirconium silicate of the cubic system or tetragonal system, and/or hafnium-zirconium silicate of the cubic system or tetragonal system, as a silicon concentration increases, the crystallization of the cubic system or tetragonal system may be maintained and insulation may be improved even if thermal load is great due to subsequent processes. Some embodiments provide that the silicon concentration may be expressed as a ratio of silicon atoms with respect to the sum of silicon atoms and metal atoms such as hafnium atoms or zirconium atoms. Some embodiments provide that the greater the silicon concentration, the smaller the dielectric constant of the thin film.

In some embodiments, when the insulating layer 500 of cubic system or tetragonal system is used as a dielectric layer of the capacitor, the silicon concentration of metal silicate included in the insulating layer 500 of the cubic system or tetragonal system may be in the range of 1 to 10%. In some embodiments, the silicon concentration may be in the range of 3 to 8% in order to achieve stable crystallization and a high dielectric constant.

Some embodiments provide that when the insulating layer 500 of the cubic system or tetragonal system includes hafnium silicate, a ratio of silicon atoms with respect to the sum of hafnium atoms and silicon atoms may be in the range of 1 to 10%, or in the range of 3 to 8%. For example, when the insulating layer 500 of the cubic system or tetragonal system includes zirconium silicate, a ratio of silicon atoms with respect to the sum of zirconium atoms and silicon atoms may be in the range of 1 to 10%, or in the range of 3 to 8%.

Some embodiments provide that when the insulating layer 500 of the cubic system or tetragonal system includes hafnium-zirconium silicate, a ratio of silicon atoms with respect to the sum of hafnium atoms, zirconium atoms and silicon atoms may be in the range of 1 to 10%, or in the range of 3 to 8%.

Although not illustrated, some embodiments provide that the dielectric layer of the capacitor may include at least two insulating layers of the cubic system or tetragonal system. In some embodiments, the dielectric layer of the capacitor may include a multilayer structure including at least one of a metal oxide layer or a metal silicate layer together with the insulating layer 500 of the cubic system or tetragonal system. Some embodiments provide that the metal oxide layer or the metal silicate layer may be, for example, an aluminum oxide (Al2O3) layer, a zirconium oxide (ZrO2) layer, an aluminum silicate (AlSix4Oy4) layer, and/or a hafnium oxide (HfO2) layer, among others. When the multilayer structure is formed by an aluminum oxide layer, a zirconium oxide layer and/or a hafnium oxide layer, a metal silicate layer may be formed at the uppermost portion.

Some embodiments of the structure and manufacturing methods of a metal silicate layer included in the insulating layer 500 of the cubic system or tetragonal system will now be described in detail. As the insulating layer 500 of the cubic system or tetragonal system may function as a dielectric substance between the lower electrode 400 and an upper electrode 600, the insulating layer 500 of the cubic system or tetragonal system may be referred to as a dielectric layer.

The upper electrode 600 is formed on the insulating layer 500 of the cubic system or tetragonal system. Some embodiments provide that the insulating layer 500 is the dielectric layer of the capacitor. In some embodiments, the upper electrode 600 may be formed of, for example, at least one material selected from the group consisting of Ru, RuO2, Ir, IrO2, Pt, Ti, TiN, WN, Ti, TaN and TiAlN, and a combination of at least one of the foregoing.

Figure 2:
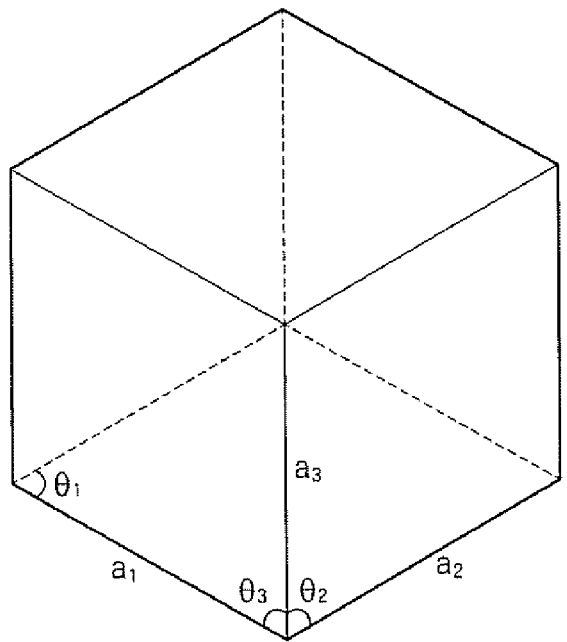
FIGS. 2 and 3 are schematic views of crystalline structures of the cubic system and tetragonal system, respectively, according to some embodiments of the present invention.
Figure 3:
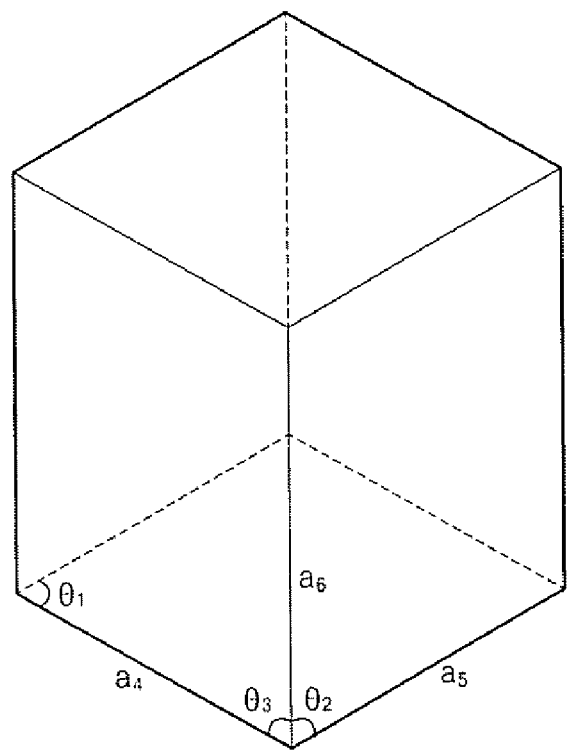

FIGS. 2 and 3 are schematic views of crystalline structures of the cubic system and tetragonal system, respectively. Referring to FIG. 2, a crystal belonging to the cubic system may have three crystal axes having angles ($\theta1=\theta2=\theta3=90°$) that are perpendicular to each other and may have the same length ($a1=a2=a3$). The cubic system may also be referred to as an isometric system.

Referring to FIG. 3, a crystal belonging to the tetragonal system may have three crystal axes having angles ($\theta1=\theta2=\theta3=90°$) that are perpendicular to each other, wherein two of the three crystal axes have the same length and the other one has a different length ($a4=a5\neq a6$).

Some embodiments provide that when the insulating layer 500 of the cubic system or tetragonal system is formed to have a greater thickness than a predetermined thickness, it can be seen that the insulating layer 500 of the cubic system or tetragonal system has the tetragonal system. In some embodiments, when the insulating layer 500 of the cubic system or tetragonal system is formed to have a relatively smaller thickness so that the insulating layer 500 of the cubic system or tetragonal system can be applied to a highly-integrated semiconductor device and it may be difficult to distinguish the lengths of crystal axes, it can be seen that the insulating layer 500 of the cubic system or tetragonal system has the cubic system. In this regard, the cubic system and tetragonal system are not particularly distinguished, and "cubic system or tetragonal system" is thus used herein.

Figure 4:
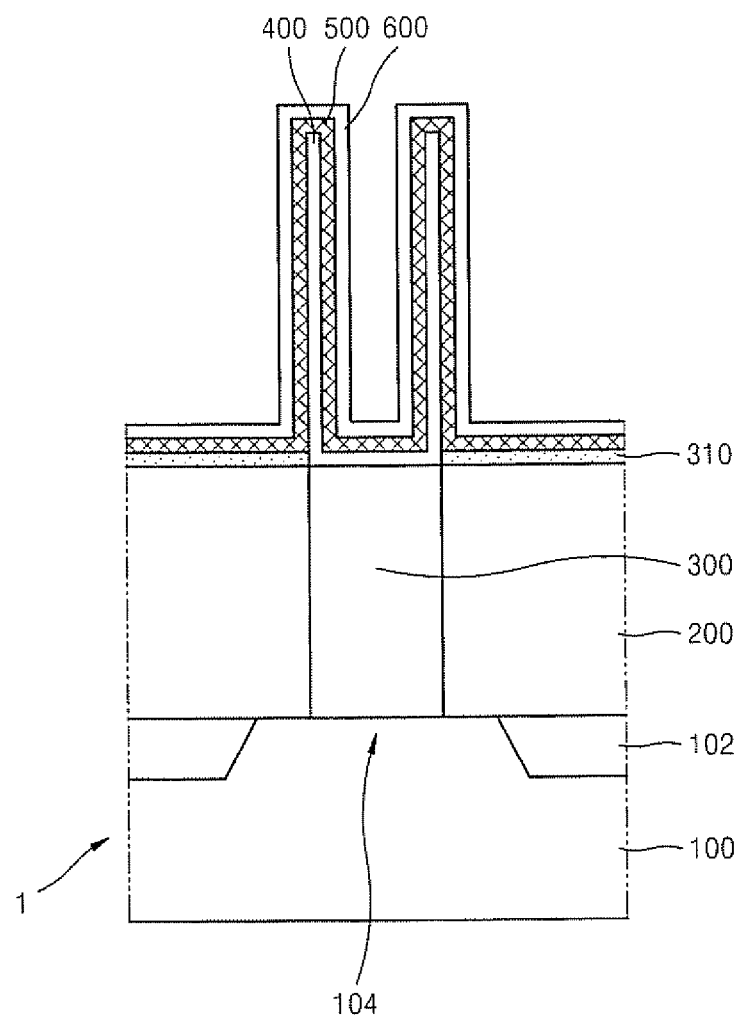

Reference is now made to FIG. 4, is a cross-sectional view of a semiconductor device 1 including an insulating layer 500 of the cubic system or tetragonal system, according to some embodiments of the present invention. Some embodiments provide that the lower electrode 400 may have a cylindrical shape. In order to form the lower electrode 400 having the cylindrical shape, a mold layer (not shown) may be formed on a part of the interlevel insulating layer 200, in which the contact plug 300 is formed. In some embodiments, an opening (not shown) through which the contact plug 300 is exposed may be formed in the mold layer and then a lower electrode material layer (not shown) may be formed on the mold layer so as to cover an entire surface of the opening instead of completely filling the opening. Then, the lower electrode material layer formed on a surface of the mold layer may be removed except for the lower electrode material layer formed on the surface of the opening. The mold layer may then be removed so that the lower electrode 400 having the cylindrical shape is formed.

In order to prevent the interlevel insulating layer 200 from being removed while removing the mold layer, an etch stopping layer pattern 310 through which the contact plug 300 is exposed may be formed on the interlevel insulating layer 200.

Some embodiments provide that the insulating layer 500 of the cubic system or tetragonal system and the upper electrode 600 may be sequentially formed on the lower electrode 400 having the cylindrical shape so that the semiconductor device 1 having a capacitor may be formed.

Figure 5:
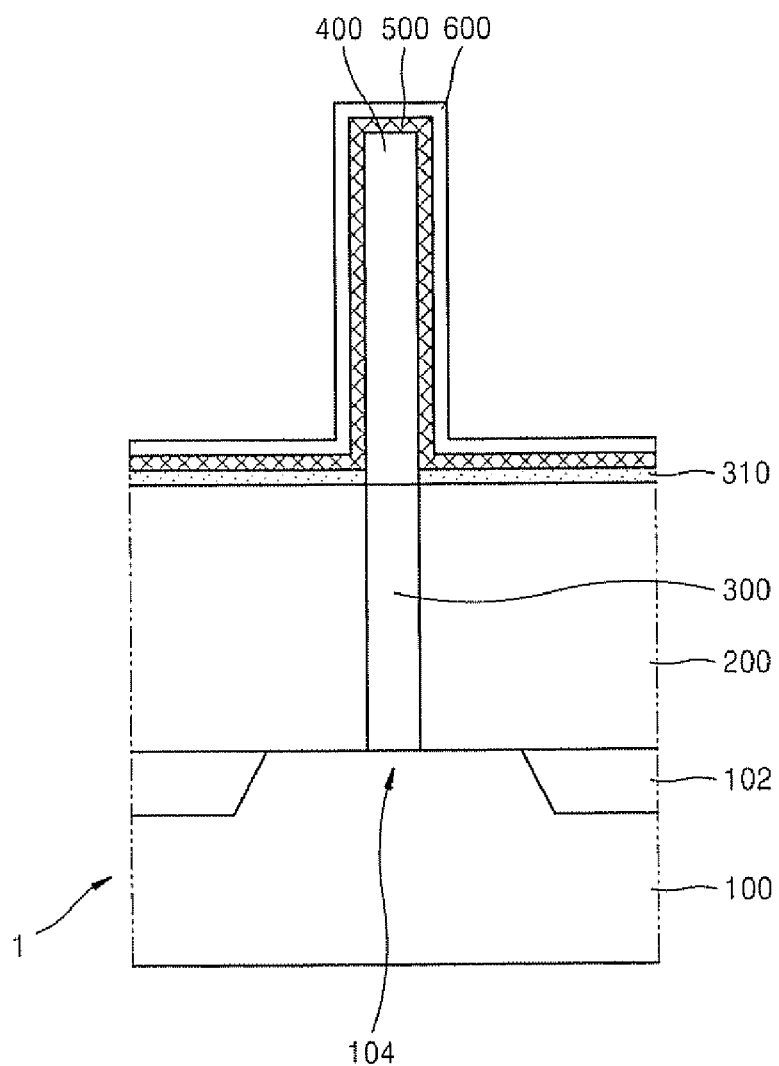

Reference is now made to FIG. 5, which is a cross-sectional view of a semiconductor device 1 including an insulating layer 500 of the cubic system or tetragonal system, according to some embodiments of the present invention. In some embodiments, the lower electrode 400 may have a pillar shape. In order to form an lower electrode 400 having the pillar shape, a mold layer (not shown) may be formed on a part of the interlevel insulating layer 200, in which the contact plug 300 is formed. An opening (not shown) through which the contact plug 300 is exposed may be formed in the mold layer and then a lower electrode material layer (not shown) may be formed on the mold layer so as to completely fill the opening. Some embodiments provide that the lower electrode material layer is then formed on the mold layer except for the lower electrode material layer that is formed in the opening is removed. The mold layer is then removed so that the lower electrode 400 having the pillar shape may be formed.

Some embodiments provide that in order to prevent the interlevel insulating layer 200 from being removed while removing the mold layer, an etch stopping layer pattern 310 through which the contact plug 300 is exposed may be formed on the interlevel insulating layer 200.

The insulating layer 500 of the cubic system or tetragonal system and the upper electrode 600 may be sequentially formed on the lower electrode 400 having the pillar shape so that the semiconductor device 1 having a capacitor may be formed.

Figure 6:
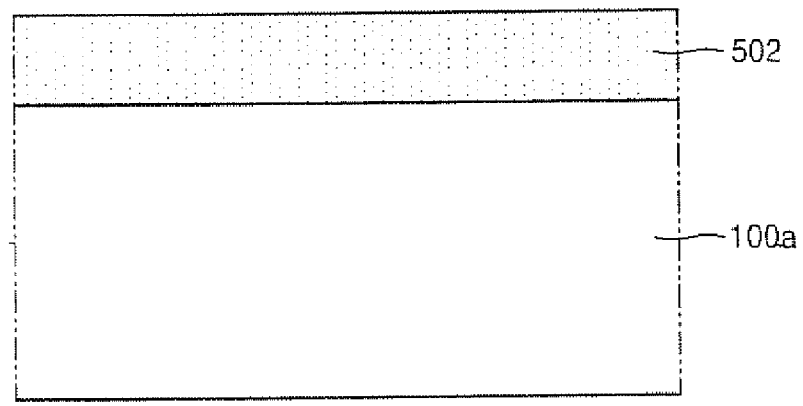
FIGS. 6 through 7 are cross-sectional views for explaining methods of forming an insulating layer of the cubic system or tetragonal system, according to some embodiments of the present invention.
Figure 7:
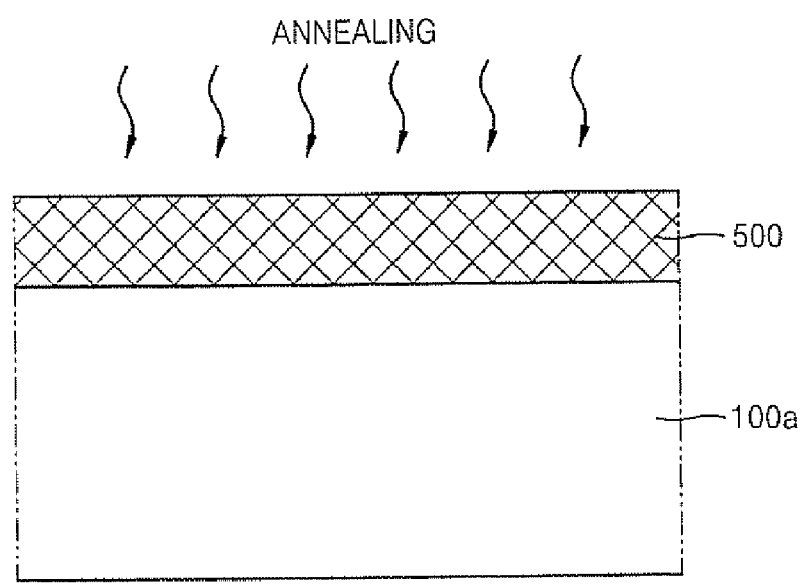

FIGS. 6 and 7 are cross-sectional views for explaining methods of forming the insulating layer 500 of the cubic system or tetragonal system, according to some embodiments of the present invention. Referring to FIG. 6, a first insulating layer 502 is formed on a semiconductor substrate 100a. In some embodiments, the semiconductor substrate 100a may be formed of, for example, a semiconductor material such as silicon, and may further include an insulating layer, a conductive layer, and/or an insulating layer and a conductive layer. Some embodiments provide that the first insulating layer 502 may be a metal silicate layer. For example, the first insulating layer 502 may be a metal silicate layer which may include a hafnium atom and/or a zirconium atom. That is, some embodiments provide that the first insulating layer 502 may be formed of hafnium silicate, zirconium silicate and/or hafnium-zirconium silicate. In other words, the first insulating layer 502 may be a hafnium oxide layer to which silicon atoms are added and some hafnium atoms are substituted by the silicon atoms, a zirconium oxide layer to which silicon atoms are added and some zirconium atoms are substituted by the silicon atoms, or a hafnium oxide layer to which zirconium atoms and silicon atoms are added and some hafnium atoms are substituted by the zirconium atoms and the silicon atoms.

In some embodiments, the first insulating layer 502 may be formed, for example, by atomic layer deposition (ALD). Some embodiments provide that a hafnium precursor, a silicon precursor and an oxidization agent for oxidizing the hafnium precursor and the silicon precursor may be provided so that hafnium silicate can be formed at a temperature in the range of 200° C. to 400° C. by ALD. In some embodiments, examples of hafnium precursors may include tetrakis ethylmethylamino hafnium (TEMAH), hafnium tert-butoxide (HTB), tetrakis dimethylamino hafnium (TDMAH) and/or tetrakis diethylamino hafnium (TDEAH), among others. Some embodiments provide that examples of silicon precursors may include tris-dimethylaminosilane (Tris-DMAS), tris-diethylaminosilane (Tris-DEAS), bis(tert-butylamino)silane (BTBAS) and/or tetrakis ethylmethylamino silicon (TEMAS), among others. In some embodiments, a zirconium precursor, a silicon precursor and an oxidation agent for oxidizing the zirconium precursor and the silicon precursor are provided so that zirconium silicate can be formed at a temperature in the range of 200° C. to 400° C. by ALD.

Some embodiments provide that a hafnium precursor, a zirconium precursor, a silicon precursor and an oxidation agent for oxidizing the hafnium precursor, the zirconium precursor and the silicon precursor are provided so that hafnium-zirconium silicate can be formed at a temperature in the range of 200° C. to 400° C. by ALD.

Referring to FIGS. 6 and 7, the insulating layer 500 of the cubic system or tetragonal system may be formed by annealing the first insulating layer 502. In some embodiments, the insulating layer 500 of the cubic system or tetragonal system may include a hafnium silicate layer of the cubic system or tetragonal system, a zirconium silicate layer of the cubic system or tetragonal system, and/or a hafnium-zirconium silicate layer of the cubic system or tetragonal system.

Some embodiments provide that the annealing process for forming the insulating layer 500 of the cubic system or tetragonal system may be rapidly performed, for example, in an atmosphere of inert gas, and/or oxygen gas at a temperature in the range of 400° C. to 700° C. In some embodiments, a relatively low temperature annealing process may be performed in order to minimize transfer of thermal energy that may adversely affect (e.g., cause diffusion, deformation, etc.) an impurity region, an insulating layer and/or a conductive layer, which are to be formed in the semiconductor substrate 100a formed below the insulating layer 500 of the cubic system or tetragonal system. In some embodiments, when the insulating layer 500 of the cubic system or tetragonal system is formed prior to forming the impurity region in the semiconductor substrate 100a, a relatively high temperature annealing process may be performed at a temperature in the range of 700° C. to 1200° C.

Figure 8:
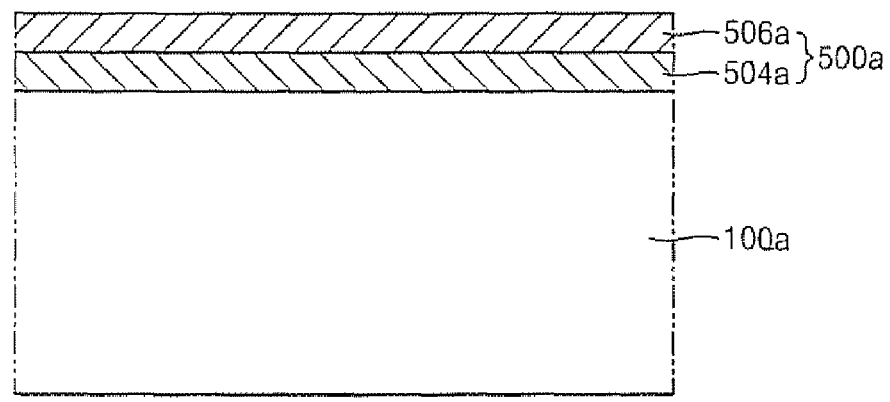
FIGS. 8 and 9 are cross-sectional views for explaining methods of forming an insulating layer of the cubic system or tetragonal system, according some further embodiments of the present invention.
Figure 9:
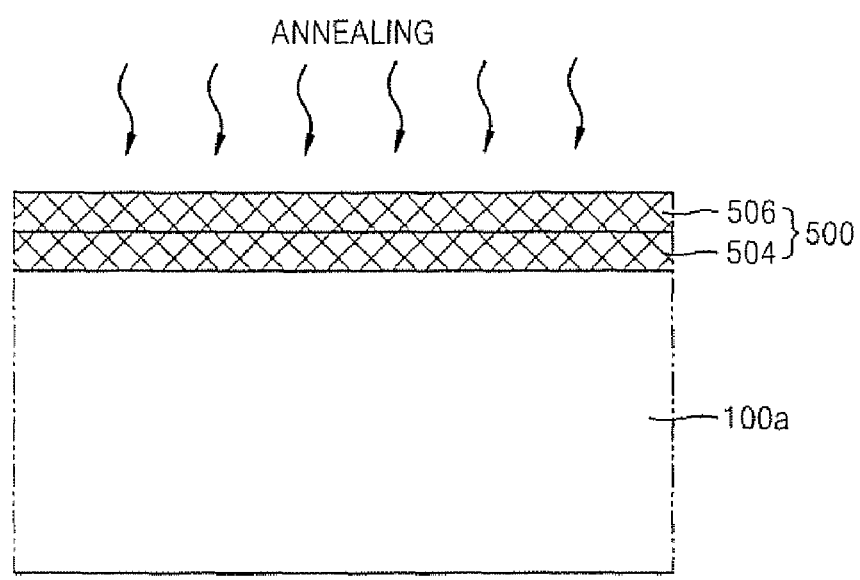

Reference is now made to FIGS. 8 and 9, which are cross-sectional views for explaining methods of forming an insulating layer 500 of cubic system or tetragonal system according to some embodiments of the present invention. Some embodiments provide that a first multilayer insulating layer 500a, including a second insulating layer 504a and a third insulating layer 506a which are alternately formed, may be formed on the semiconductor substrate 100a. In some embodiments, the second insulating layer 504a may be selected so as to obtain crystallization of the cubic system or tetragonal system by a lower temperature annealing process compared to the case of the third insulating layer 506a.

In some embodiments, the first multilayer insulating layer 500a including the second insulating layer 504a and the third insulating layer 506a which may be alternately formed may be converted to the insulating layer 500 of the cubic system or tetragonal system by annealing. In some embodiments, the second insulating layer 504a may be selected so as to obtain crystallization of the cubic system or tetragonal system by a lower temperature annealing process compared to the case of the third insulating layer 506a. In this manner, the second insulating layer 504a may be previously converted to a second insulating layer 504 of the cubic system or tetragonal system as compared to the third insulating layer 506a. Some embodiments provide that due to the influence of the second insulating layer 504 of the cubic system or tetragonal system, the third insulating layer 506a may be converted to a third insulating layer 506 of the cubic system or tetragonal system by annealing at a lower temperature than a general temperature to obtain the original crystallization of the cubic system or tetragonal system. Thus, the insulating layer 500 of the cubic system or tetragonal system, which may include the second insulating layer 504 and the third insulating layer 506 of the cubic system or tetragonal system, can be formed. In some embodiments, annealing for forming the insulating layer 500 of the cubic system or tetragonal system may be performed at a temperature in the range of 400° C. to 600° C.

Figure 10:
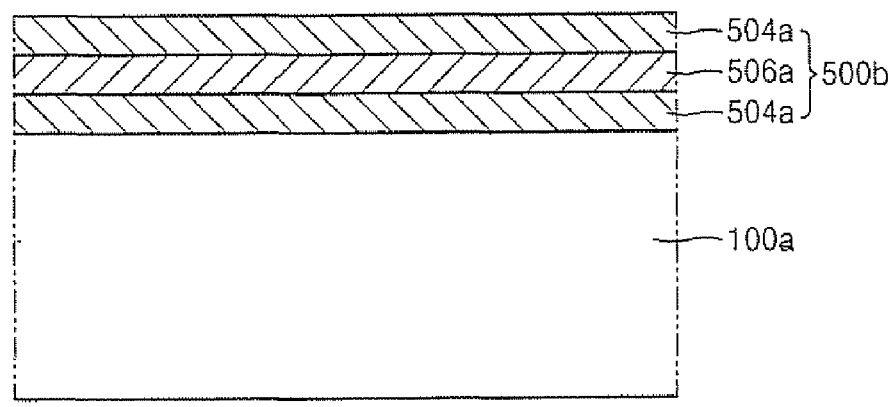
FIGS. 10 and 11 are cross-sectional views for explaining methods of forming an insulating layer of the cubic system or tetragonal system, according to yet further embodiments of the present invention.
Figure 11:
Figure 11:
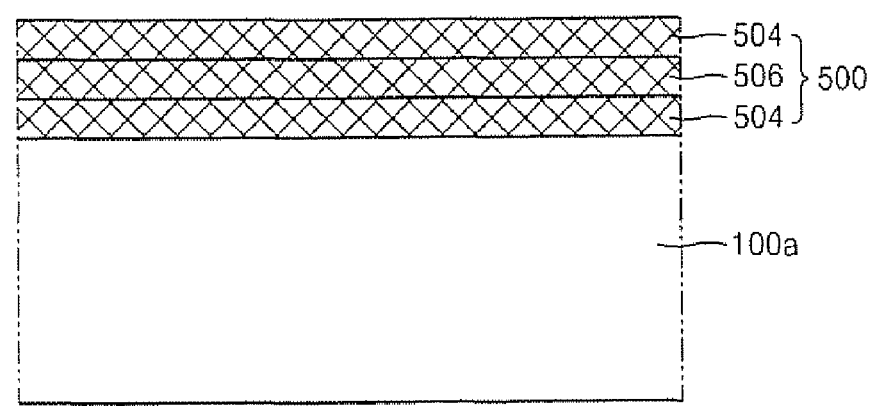

Reference is now made to FIGS. 10 and 11, which are cross-sectional views for explaining methods of forming an insulating layer 500 of the cubic system or tetragonal system according to some embodiments of the present invention. Some embodiments provide that a multilayer insulating layer 500b including a second insulating layer 504a, a third insulating layer 506a and a second insulating layer 504a, which are sequentially formed, may be formed on the semiconductor substrate 100a. In some embodiments, the second insulating layer 504a may be selected so as to obtain crystallization of the cubic system or tetragonal system by a lower temperature annealing process compared to the case of the third insulating layer 506a.

Some embodiments provide that the multilayer insulating layer 500b can be converted to the insulating layer 500 of the cubic system or tetragonal system by annealing. As discussed above regarding FIGS. 6 and 7, the second insulating layers 504 formed on and below the third insulating layer 506a may be previously converted to the second insulating layer 504 of the cubic system or tetragonal system by annealing. In some embodiments, due to the influence of the second insulating layer 504 of the cubic system or tetragonal system, the third insulating layer 506a can be converted to a third insulating layer 506 of the cubic system or tetragonal system by a relatively low temperature annealing process. Accordingly, the insulating layer 500 of the cubic system or tetragonal system, in which the second insulating layer 504, the third insulating layer 506 and the second insulating layer 504 of the cubic system or tetragonal system are sequentially formed, may be formed at a relatively low temperature. In this regard, leakage current due to deterioration caused by annealing may be prevented.

Although not illustrated, some embodiments provide that the insulating layer 500 of the cubic system or tetragonal system may be formed by alternately stacking n second insulating layers and n third insulating layers and/or by forming m third insulating layers between m+1 second insulating layers and then performing annealing (n and m are both positive integers greater than 2).

Figure 12:
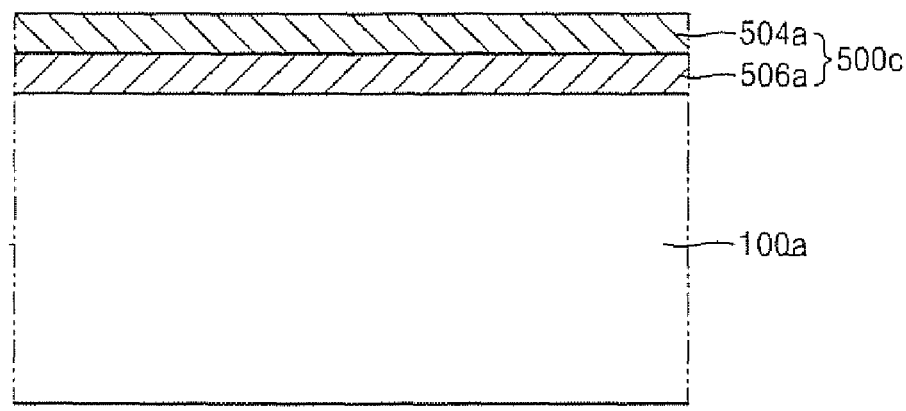
FIGS. 12 through 13 are cross-sectional views for explaining methods of forming the insulating layer of the cubic system or tetragonal system, according to some further embodiments of the present invention.
Figure 13:
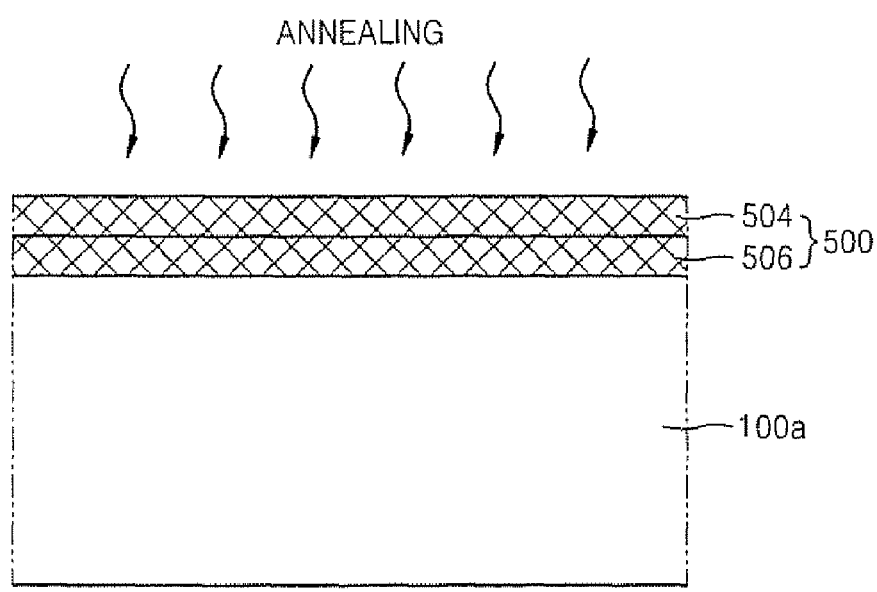

Reference is now made to FIGS. 12 through 13, which are cross-sectional views for explaining methods of forming the insulating layer 500 of the cubic system or tetragonal system according to some embodiments of the present invention. Some embodiments provide that a multilayer insulating layer 500c including a third insulating layer 506a and a second insulating layer 504a may be formed on the semiconductor substrate 100a. Some embodiments provide that the second insulating layer 504a may be selected so as to obtain crystallization of the cubic system or tetragonal system by a lower temperature annealing process compared to the case of the third insulating layer 506a.

In some embodiments, the multilayer insulating layer 500c including the third insulating layer 506a and the second insulating layer 504a, which may be alternately formed, can be converted to the insulating layer 500 of the cubic system or tetragonal system by annealing. The second insulating layer 504a may be selected so as to obtain crystallization of the cubic system or tetragonal system by a lower temperature annealing process compared to that of the third insulating layer 506a. In this manner, the second insulating layer 504a can be previously converted to the second insulating layer 504 of the cubic system or tetragonal system compared to the third insulating layer 506a. Due to the influence of the second insulating layer 504 of the cubic system or tetragonal system, the third insulating layer 506a may be converted to the third insulating layer 506 of the cubic system or tetragonal system by annealing at a lower temperature than a general temperature that may be used in obtaining original crystallization of the cubic system or tetragonal system. Thus, the insulating layer 500 of the cubic system or tetragonal system including the third insulating layer 506 and the second insulating layer 504 of the cubic system or tetragonal system may be formed. Some embodiments provide that annealing for forming the insulating layer 500 of the cubic system or tetragonal system may be performed at a temperature in the range of 400° C. to 600° C.

Generally, a seed, which may affect the crystallization of an element to be formed in subsequent operations, may be previously formed as a lower layer so as to have crystallization. Then an upper layer may be formed on the lower layer that is the seed and may be crystallized along with the crystallization of the seed. In the some embodiments, the second insulating layer 504a may be formed so as to previously obtain crystallization of the cubic system or tetragonal system during annealing after the third insulating layer 506a is formed. In this manner, the second insulating layer 504 of the cubic system or tetragonal system, which previously obtains crystallization, may function as a seed, but the second insulating layer 504 of the cubic system or tetragonal system may not necessarily be formed as a lower layer. Thus, although the second insulating layer 504a may be formed as a lower layer or an upper layer, the third insulating layer 506a may be converted to the third insulating layer 506 of the cubic system or tetragonal system at a relatively low temperature. In this manner, the insulating layer 500 of the cubic system or tetragonal system, in which the third insulating layer 506, the second insulating layer 504 and the third insulating layer 506 of the cubic system or tetragonal system may be sequentially formed, may be formed at a relatively low temperature. Thus, leakage current due to deterioration caused by annealing may be prevented.

Although not illustrated, the insulating layer 500 of the cubic system or tetragonal system may be formed by alternately stacking n second insulating layers and n third insulating layers and/or by forming k second insulting layers 508b between k+1 third insulating layers and then performing an annealing (n is a positive integer greater than 2, and k is a positive integer greater than 1).

Referring back to FIGS. 8 and 9, some embodiments provide that the second insulating layer 504a may be a zirconium-based oxide layer. In addition, in FIGS. 8 and 9, the third insulating layer 506a may be a hafnium silicate layer. In some embodiments, the zirconium-based layer may be a zirconium oxide ($ZrO_2$) layer and/or a zirconium silicate ($Zr_{x2}Si_{y2}O_{z2}$) layer, among others. Some embodiments provide that the zirconium-based layer may be formed by annealing at a temperature in the range of 200° C. to 400° C. by performing ALD that may provide a zirconium precursor and an oxidizing agent to oxidize the zirconium precursor. In some embodiments, the zirconium-based oxide layer may be formed of a silicon precursor and zirconium silicate.

Generally, a relatively high temperature annealing process may be used for a hafnium silicate layer to obtain crystallization of the cubic system or tetragonal system. However, some embodiments provide that the zirconium-based oxide layer may obtain crystallization of the cubic system or tetragonal system by performing a relatively low temperature annealing process. In this regard, due to the influence of the zirconium-based oxide layer, which previously may obtain crystallization of the cubic system or tetragonal system at a relatively low temperature, the hafnium silicate layer may obtain crystallization of the cubic system or tetragonal system.

In FIGS. 8 through 13, some embodiments provide that the second insulating layer 504a may be a first hafnium silicate layer and the third insulating layer 506a may be a second hafnium silicate layer. In some embodiments, a first silicon concentration, which is a ratio of silicon atoms with respect to the sum of hafnium atoms and silicon atoms, contained in the first hafnium silicate, is smaller than a second silicon concentration, which is a ratio of silicon atoms with respect to hafnium atoms and silicon atoms, contained in the second hafnium silicate. Some embodiments provide that as the concentration of silicon atoms substituting hafnium atoms is increased, a higher temperature may be used so that the hafnium silicate layer obtains crystallization of the cubic system or tetragonal system. In this regard, the first hafnium silicate layer having the first silicon concentration smaller than the second silicon concentration may obtain crystallization of the cubic system or tetragonal system via a lower temperature annealing process compared to that of the second hafnium silicate layer.

FIGS. 14 through 17 are graphs for showing X-ray diffraction (XRD) and leakage current, indicating the crystallization of the two insulating layers of the cubic system or tetragonal system of FIGS. 8 and 9, and 10 and 11, according to some embodiments of the present invention.

Figure 14:
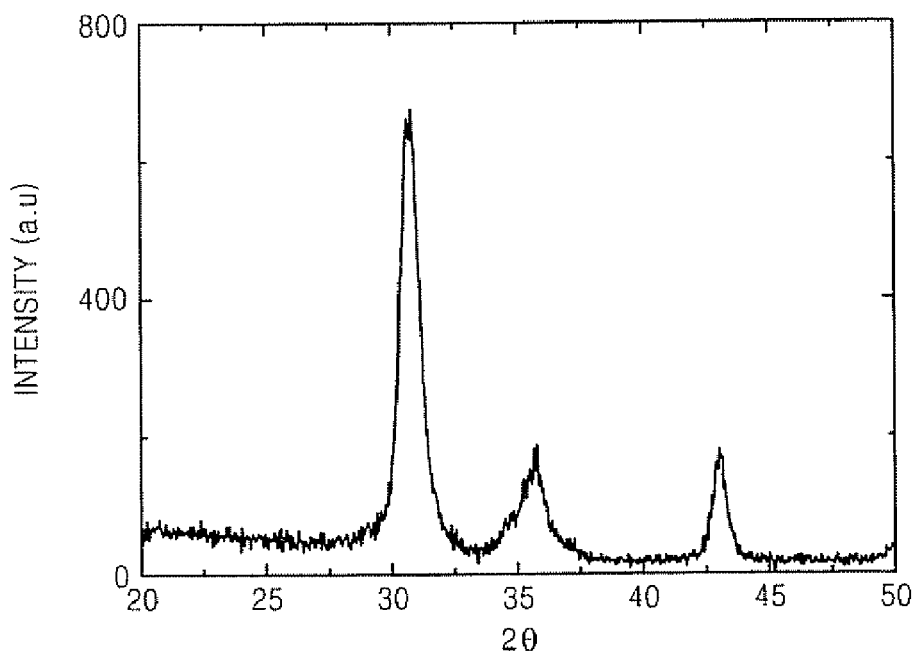
FIGS. 14 through 17 are graphs showing X-ray diffraction (XRD) and leakage current, indicating the crystallization of two insulating layers of the cubic system or tetragonal system of FIGS. 8 and 9, and 10 and 11, according to some embodiments of the present invention.

Referring to FIGS. 8, 9 and 14, some embodiments provide that the second insulating layer 504a may be formed of a zirconium oxide layer, the third insulating layer 506a may be formed of hafnium silicate, and annealing may be rapidly performed at a temperature of 500° C. In some embodiments, an XRD measurement may then be performed with respect to the second insulating layer 504a and the third insulating layer 506a. From the XRD measurement, it can be seen that the second insulating layer 504a and the third insulating layer 506a may obtain crystallization of the cubic system or tetragonal system.

Figure 15:
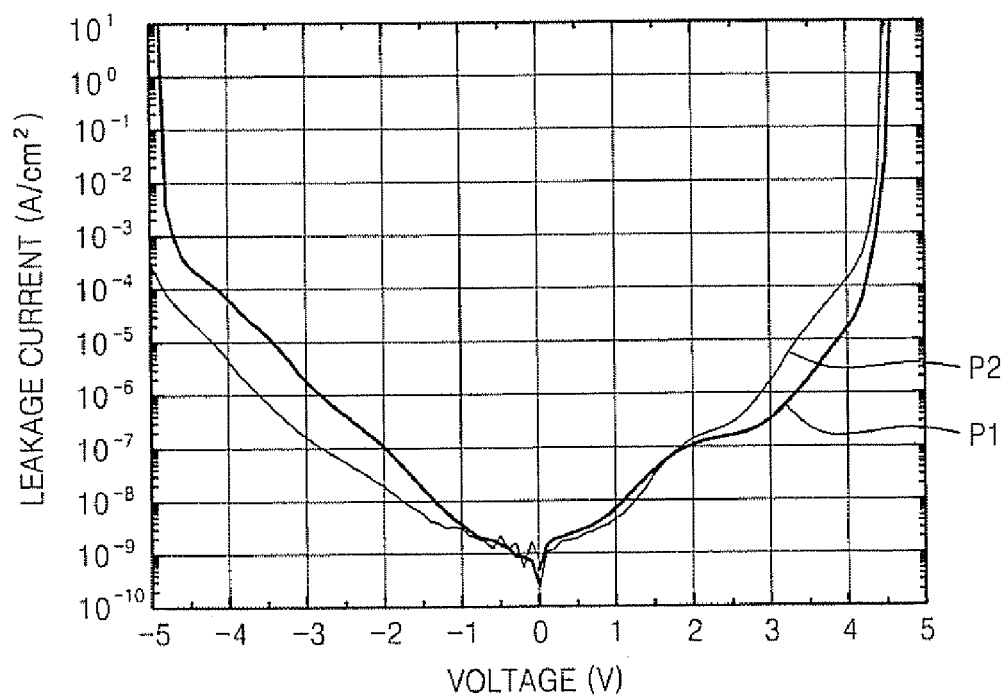

Referring to FIG. 15, it can be seen that a leakage current P1 of a multilayer insulating layer of the cubic system or tetragonal system, in which a hafnium silicate is formed on a zirconium layer, is smaller than a leakage current P2 of an insulting layer formed of only hafnium silicate. In this regard, a desired insulating layer of a cubic system or tetragonal system can be used according to the complexity of processes and desired characteristics of a semiconductor device.

Figure 16:
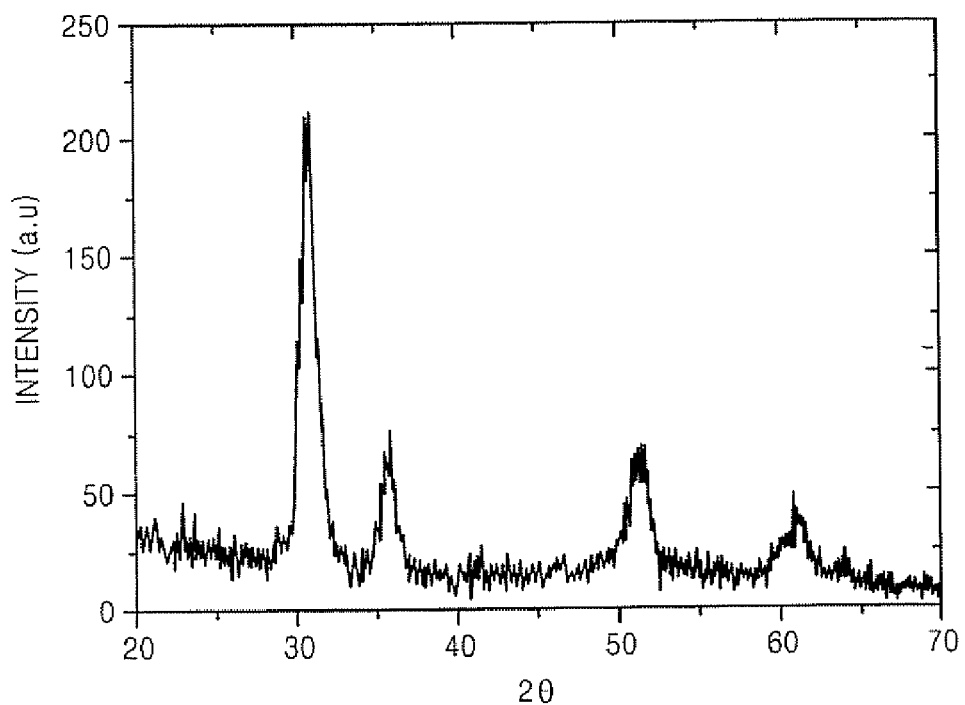

Referring to FIGS. 8, 9 and 16, some embodiments provide that the second insulating layer 504a is formed of hafnium silicate having a low silicon concentration and the third insulating layer 506a is formed of hafnium silicate having a high silicon concentration. In some embodiments, the hafnium silicate is formed, annealing is rapidly performed with respect to the hafnium silicate, and then XRD measurement is performed on the hafnium silicate with respect to the hafnium silicate. From the XRD measurement, it can be seen the second insulating layer 504a and the third insulating layer 506a may obtain crystallization of the cubic system or tetragonal system.

Figure 17:
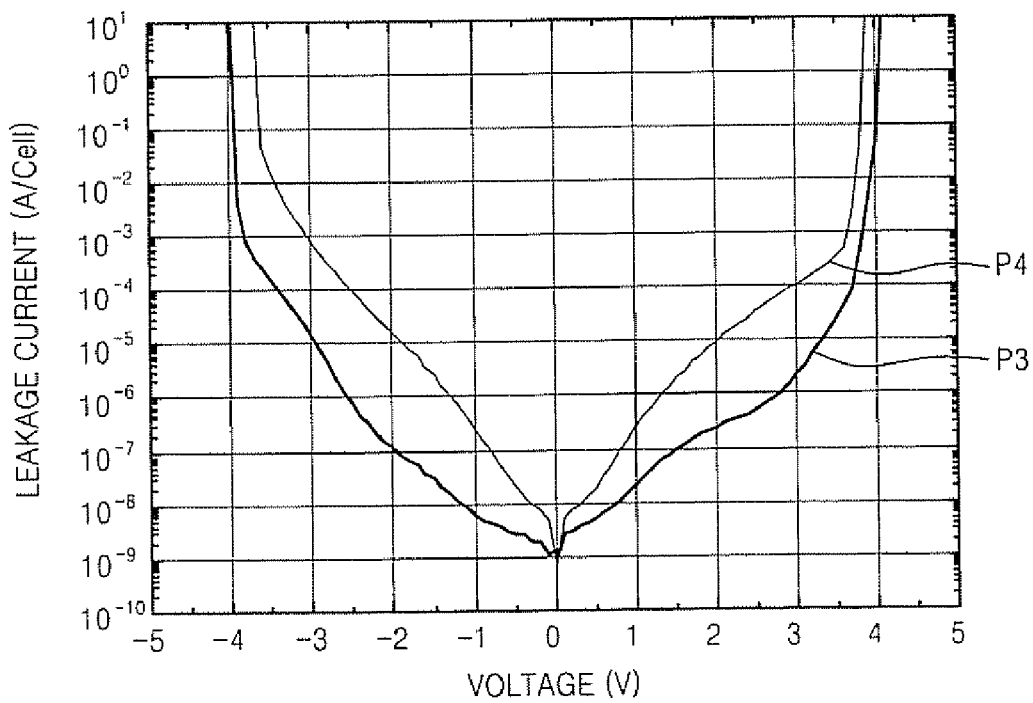

Referring to FIG. 17, it can be seen that a leakage current P3 of a multilayer insulating layer of the cubic system or tetragonal system, in which a hafnium silicate layer having a high silicon concentration is formed on a hafnium oxide layer having a low silicon concentration, may be smaller than a leakage current P4 of an insulating layer formed of only a hafnium silicate having a constant silicon concentration. In this regard, a desired insulating layer of the cubic system or tetragonal system may be used according to the complexity of processes and desired characteristics of a semiconductor device.

Figure 18:
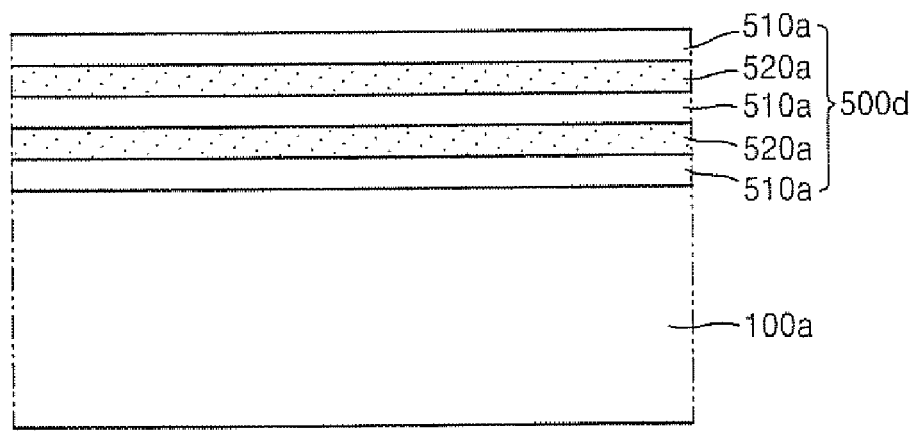
FIGS. 18 and 19 are cross-sectional views for explaining methods of forming an insulating layer of the cubic system or tetragonal system, according to some further embodiments of the present invention.
Figure 19:
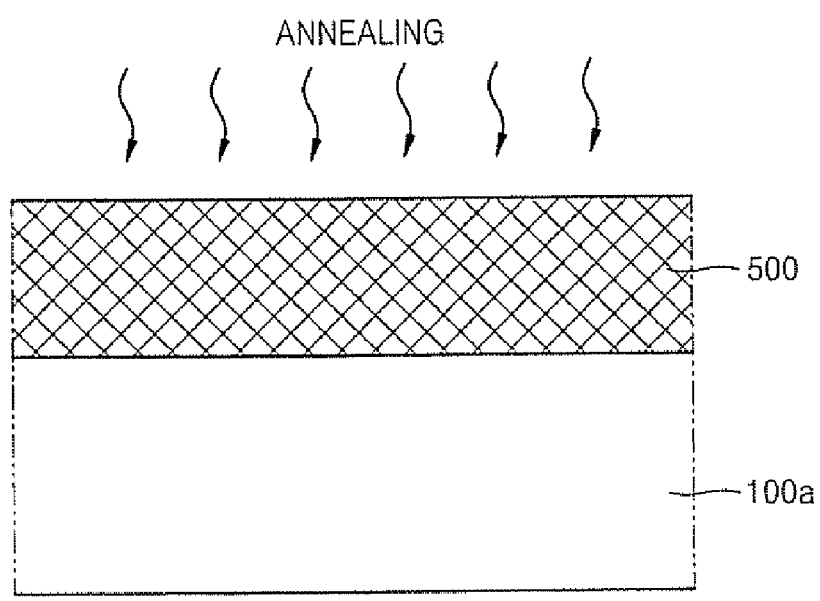

Reference is now made to FIGS. 18 and 19, are cross-sectional views for explaining methods of forming an insulating layer 500 of the cubic system or tetragonal system according to some embodiments of the present invention. Some embodiments provide that a fourth multilayer insulating layer 500d, in which a metal oxide layer 510a and a silicon oxide layer 520a may be alternately formed, is formed on a semiconductor substrate 100a. In some embodiments, the metal oxide layer 510a may be, for example, a hafnium oxide layer and/or a zirconium oxide layer, among others. Some embodiments provide that the thicknesses of the metal oxide layer 510a and the silicon oxide layer 520a are controlled so as to determine a composition ratio between a metal atom (e.g., a hafnium atom or a zirconium atom) and silicon (Si). In this regard, some embodiments provide that the metal oxide layer 510a and the silicon oxide layer 520a may be formed by ALD, chemical vapor deposition (CVD) and/or sputtering, among others.

In some embodiments, the fourth multilayer insulating layer 500d is formed so that metal atoms of the metal oxide layer 510a are partially substituted by silicon atoms by performing a subsequent process. Accordingly, some embodiments provide that the number of metal oxide layers may be greater than the number of silicon oxide layers by one. That is, the silicon oxide layer 520a may be formed between metal oxide layers. In some embodiments, three metal oxide layers may be formed and two silicon oxide layers may be formed between ones of the three metal oxide layers. However, as long as the silicon oxide layer 520a is disposed between the metal oxide layers, the numbers of the metal oxide layers 510a and the silicon oxide layers 520a are not so limited to particular numbers.

In a subsequent process, some embodiments provide that the metal oxide layer 510a and the silicon oxide layer 520a may be formed as a single layer in which metal atoms and silicon atoms regularly exist. In this regard, the thickness of the silicon oxide layer 520a may be determined according to the thickness of the metal oxide layer 510a so as to control the ratio of silicon atoms with respect to the sum of metal atoms and silicon atoms included in the metal oxide layer 510a and the silicon oxide layer 520a. In addition, some embodiments provide that the thickness of the metal oxide layer 510a may be determined according to process conditions so that silicon atoms of the silicon oxide layer 520a and metal atoms of the metal oxide layer 510a may be regularly substituted in a subsequent process.

Referring to FIGS. 18 and 19, annealing for crystallization and densification may be performed on the fourth multilayer insulating layer 500d and thus the insulating layer 500 of the cubic system or tetragonal system may be formed. Some embodiments provide that the insulating layer 500 of the cubic system or tetragonal system may be formed of, for example, hafnium silicate and/or zirconium silicate, among others. In some embodiments, the annealing for forming the insulating layer 500 of the cubic system or tetragonal system may be rapidly performed in an atmosphere of inert gas and/or oxygen gas at a temperature in the range of 400° C. to 700° C. Some embodiments provide that, in order to reduce an application of thermal energy, the annealing, plasma annealing or vacuum annealing may be performed at a temperate in the range of 200° C. to 400° C.

Figure 20:
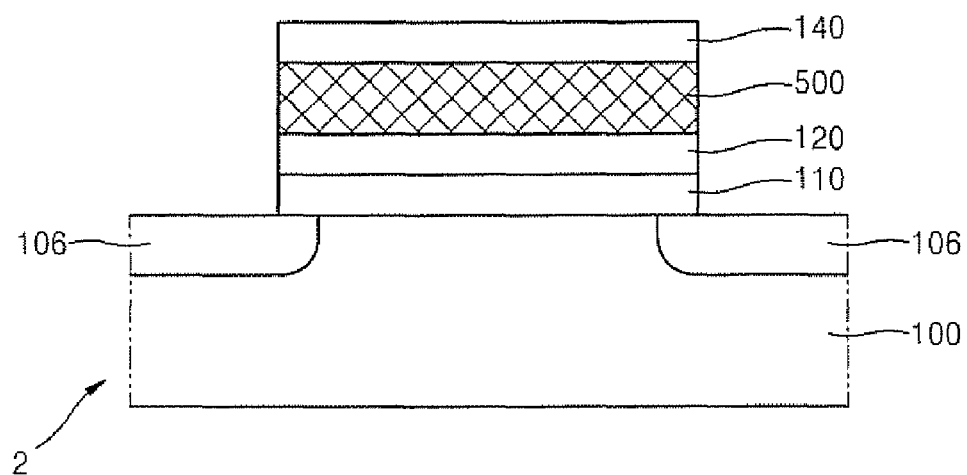

Reference is now made to FIG. 20, is a cross-sectional view of a semiconductor device 2 including an insulating layer 500 of the cubic system or tetragonal system according to some embodiments of the present invention. In some embodiments, the semiconductor device 2 includes the insulating layer 500 of the cubic system or tetragonal system, which may be used as a blocking insulating layer. A tunneling oxide layer 110 may be formed on a semiconductor substrate 100. Some embodiments provide that the semiconductor substrate 100 may be formed of, for example, a general semiconductor such as a silicon substrate. An impurities injection region (not shown) such as a well for forming a semiconductor device (e.g., a transistor) may be formed in the semiconductor substrate 100. Some embodiments provide that a device separation layer (not shown) for separating semiconductor devices, a source and/or drain region 106, may be formed on the semiconductor substrate 100.

In some embodiments, the tunneling oxide layer 110 may be formed so as to create tunneling and to have a thickness in the range of 30 to 800 Å. Some embodiments provide that the tunneling oxide layer 110 may include a silicon oxide ($SiO_2$)

layer or a hafnium or zirconium oxide layer, but the invention described herein is not limited thereto.

A charge storage layer 120 may be formed on the tunneling oxide layer 110. The charge storage layer 120 may be formed so as to have a thickness in the range of 20 to 200 Å, and may be formed according to a variety of embodiments. In some embodiments, the charge storage layer 120 may be formed of a conductive layer and may function as a floating gate. In such embodiments, the charge storage layer 120 may be formed of, for example, a conductor including polysilicon that is not doped, doped polysilicon with n-type or p-type impurities, and/or metal.

In some embodiments, the charge storage layer 120 may be formed of an insulator and may function as a trap layer. Some embodiments provide that a charge storage layer 120 functioning as a trap layer may be formed of a material having a greater dielectric constant than that of a silicon oxide layer and having a smaller dielectric constant than that of a blocking insulating layer that will be described below. For example, when the dielectric constant of the silicon layer is 3.9, the dielectric constant of the charge storage layer 120 may be formed of a silicon nitride layer having a dielectric constant of about 6. In this manner, the blocking insulating layer may be formed so as to have a greater dielectric constant than 6. In such embodiments, the charge storage layer 120 may be formed of a nitride layer such as a silicon nitride layer, an aluminum layer and/or a silicon oxynitride layer, among others.

Some embodiments provide that the blocking insulating layer is formed on the charge storage layer 120. The blocking insulating layer may be the insulating layer 500 of the cubic system or tetragonal system. The insulating layer 500 of the cubic system or tetragonal system may be a metal silicate layer including hafnium atoms and/or zirconium atoms. That is, some embodiments provide that the insulating layer 500 of the cubic system or tetragonal system may be formed of, for example, hafnium silicate (Hfx1Siy1Oz1), zirconium silicate (Zrx2Siy2Oz2) or hafnium-zirconium silicate ((Hf,Zr)x3Siy3Oz3).

In some embodiments, the insulating layer 500 of the cubic system or tetragonal system may be a multilayer including a metal silicate layer including hafnium atoms and/or zirconium-based oxide layer. Some embodiments provide that the zirconium-based oxide layer may be, for example, a zirconium oxide (ZrO2) layer or a zirconium silicate (Zrx2Siy2Oz2) layer.

Since the insulating layer 500 of the cubic system or tetragonal system may have a large dielectric constant, when the insulating layer 500 is used as the blocking insulating layer, even if the thickness of the insulating layer 500 is increased, the same voltage may be used, and thus movement of charges may be further reduced. In addition, in the case of metal silicate layer including silicon, as the ratio of a silicon concentration with respect to the sum of metal atoms and silicon atoms is increased, an energy bandgap may be increased. Thus, movement of charges may be effectively prevented. Thus, in embodiments where the insulating layer 500 of the cubic system or tetragonal system is used as the blocking insulating layer, the silicon concentration of the metal silicate included in the insulating layer 500 of the cubic system or tetragonal system may be selected from among 8 to 35%.

For example, some embodiments provide that when the insulating layer 500 of the cubic system or tetragonal system is formed of hafnium silicate, the ratio of silicon atoms with respect to the sum of hafnium atoms and silicon atoms may be selected from among 8 to 35%. In some embodiments, when the insulating layer 500 of the cubic system or tetragonal system is formed of zirconium silicate, the ratio of silicon atoms with respect to the sum of hafnium atoms and silicon atoms may be selected from among 8 to 35%.

Some embodiments provide that when the insulating layer 500 of cubic system or tetragonal system is formed of hafnium-zirconium silicate, the ratio of silicon atoms with respect to the sum of hafnium atoms, zirconium atoms and silicon atoms may be selected from among 8 to 35%.

Although not illustrated, some embodiments provide that the blocking insulating layer may include at least two insulating layers of the cubic system or tetragonal system. In some embodiments, the blocking insulating layer may include a multilayer structure including a metal oxide layer and/or a metal silicate layer together with the insulating layer 500 of the cubic system or tetragonal system. The metal oxide layer and/or the metal silicate layer may be formed of, for example, aluminum oxide (Al2O3), zirconium oxide (ZrO2), aluminum silicate (AlSix4Oy4) and/or hafnium oxide (HfO2), among others. When forming a multilayer structure including an aluminum oxide layer, a zirconium oxide layer and/or a hafnium oxide layer, the metal silicate layer may be formed at the uppermost portion.

In some embodiments, a gate electrode layer 140 is formed on the insulating layer 500 of the cubic system or tetragonal system. The gate electrode layer 140 may be formed of, for example, a material selected from the group consisting of polysilicon, metal and metal silicide or a conductor that is a mixture including at least one of the foregoing. Some embodiments provide that the gate electrode layer 140 may be formed of, for example, a material selected from the group consisting of TaN, TaCN, TiN, TiAlN, W, WN, SrRuO3, Ru, RuO2 and doped polysilicon or an insulator that is a mixture including at least one of the foregoing.

As described above, when the charge storage layer 120 is formed of a conductor, a flash memory device that is a floating gate type nonvolatile memory device can be formed. In some embodiments, when the charge storage layer 120 is formed of an insulator, a charge trap type flash memory type that is a floating trap type memory device can be formed.

Figure 21:
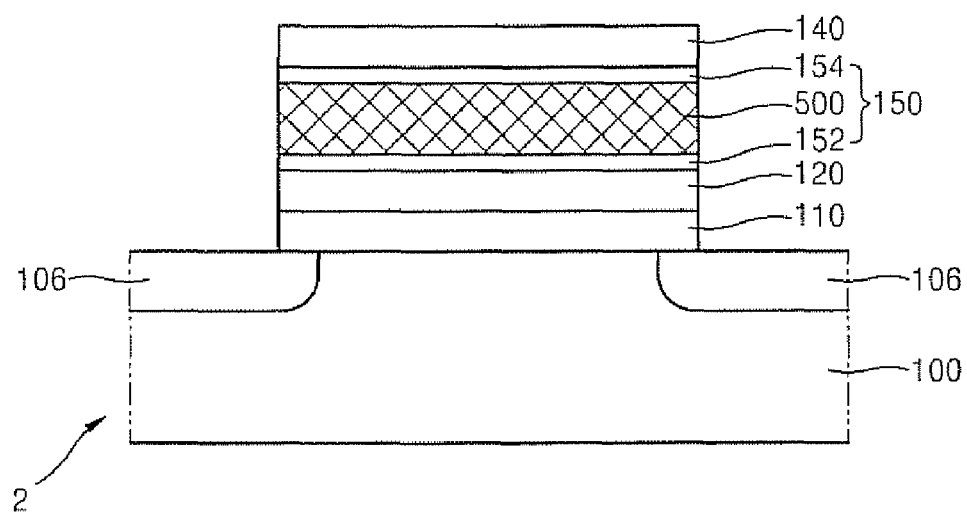

Reference is now made to FIG. 21, which is a semiconductor device a including an insulating layer 500 of the cubic system or tetragonal system according to some embodiments of the present invention. In some embodiments, a blocking insulating layer 150 may include a first or second silicon oxide layer 152 or 154 together with the insulating layer 500 of the cubic system or tetragonal system. The first silicon oxide layer 152 may be disposed at the lowermost portion of the blocking insulating layer 150 so as to contact the charge storage layer 120. The second silicon oxide layer 154 may be disposed at the uppermost portion of the blocking insulating layer 150 so as to contact the gate electrode layer 140. The blocking insulating layer 150 may include both the first silicon oxide layer 152 and the second silicon oxide layer 154, as illustrated in FIG. 21. Some embodiments provide that the blocking insulating layer 150 may include one of the first silicon oxide layer 152 or the second silicon oxide layer 154. Accordingly, movement of charges may be effectively prevented.

As described above, some embodiments provide that the blocking insulating layer 150 may include at least two insulating layers of the cubic system or tetragonal system. In some embodiments, the blocking insulating layer 150 may include a multilayer structure including at least one metal oxide layer or at least one metal silicate layer.

Figure 22:
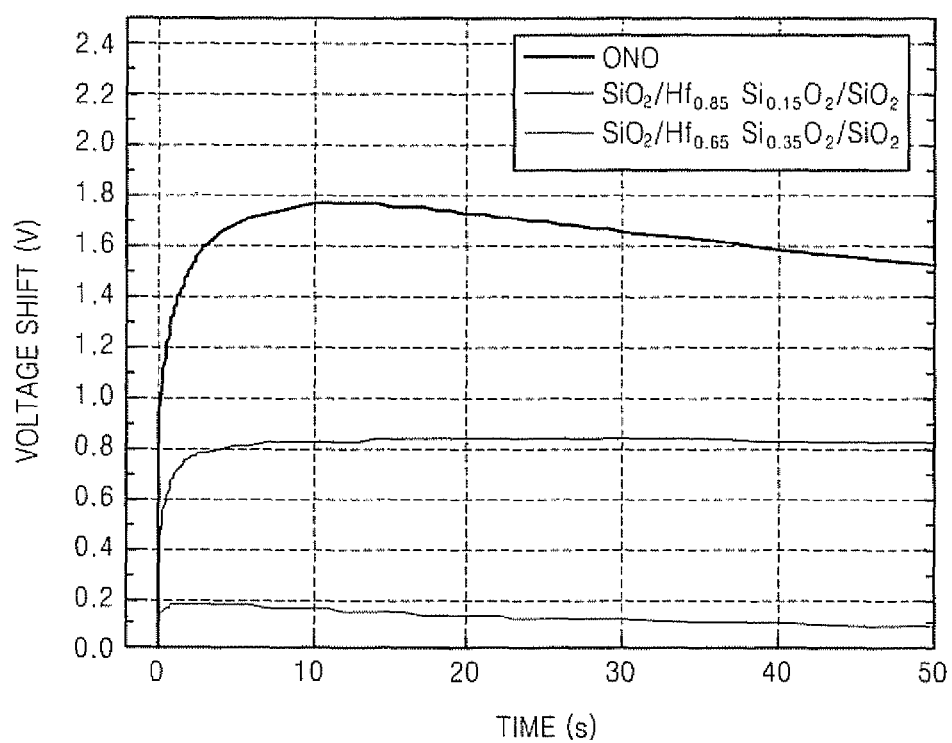
FIGS. 22 and 23 are graphs for showing voltage shift under a constant current stress of an insulating layer of the cubic system or tetragonal system according to some embodiments of the present invention and an insulating layer having an oxide-nitride-oxide (ONO) structure, respectively.
Figure 23:
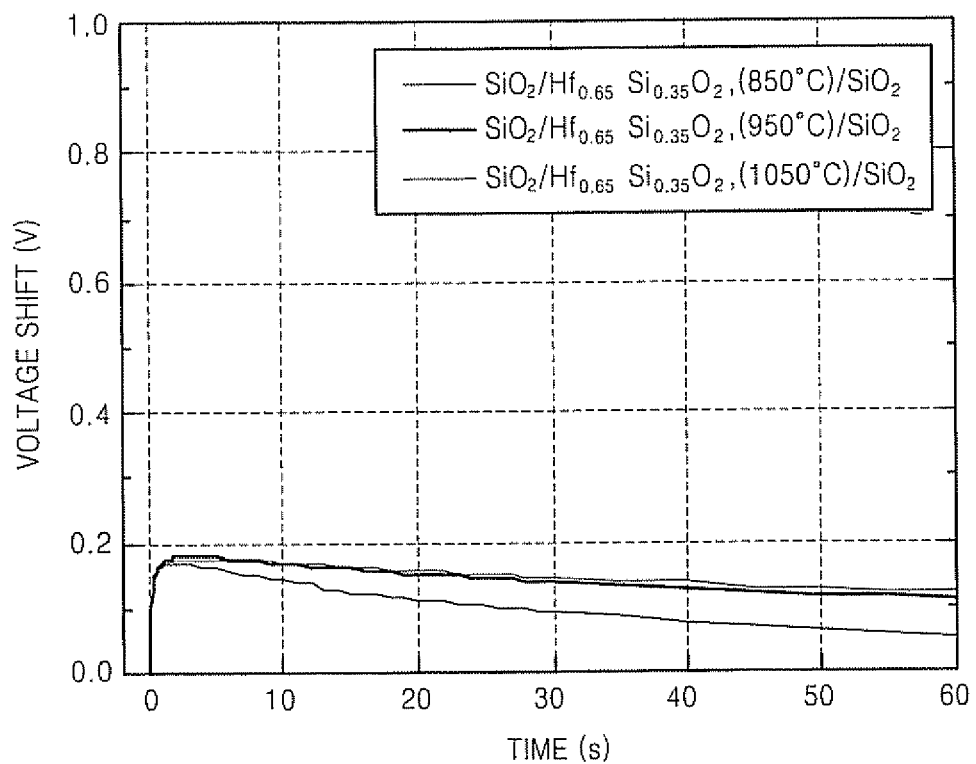

Reference is now made to FIGS. 22 and 23, which are graphs for showing voltage shift under a constant current stress of an insulating layer of the cubic system or tetragonal system according to some embodiments of the present invention and an insulating layer having an oxide-nitride-oxide (ONO) structure, respectively. The insulating layer having crystallization of the cubic system or tetragonal system, in which silicon oxide layers are formed on and below a hafnium silicate layer, and the insulating having the ONO structure are compared in terms of voltage shift as a function of time under a constant current stress. The silicon oxide layer formed on the hafnium silicate layer having crystallization of the cubic system and tetragonal system may have the same thickness as the silicon oxide layer formed on the ONO structure. In addition, the silicon oxide layer formed below the hafnium silicate layer having crystallization of the cubic system and tetragonal system may have the same thickness as the silicon oxide layer formed below the ONO structure.

As illustrated by the voltage shift result, the hafnium silicate having crystallization of the cubic system or tetragonal system has smaller voltage shift compared with that of the insulating layer having the ONO structure. In addition, as the silicon concentration of the hafnium silicate layer of the cubic system or tetragonal system is increased (by 15% or 35%), voltage shift may be further reduced. That is, when using the hafnium silicate layer of the cubic system or tetragonal system having a large silicon concentration, the voltage shift is further reduced. Accordingly, when the hafnium silicate layer of the cubic system or tetragonal system has a large silicon concentration, the electron trapping inside the blocking insulating layer 150 may be reduced.

As illustrated in FIGS. 20 and 21, in the case of a non-volatile memory device 2, a coupling ratio between the tunneling oxide layer 110 and the blocking insulating layer 150 may be an important factor for preventing movement of charges. That is, the coupling ratio, which is a ratio of capacitance of the blocking insulating layer 150 with respect to the sum of capacitances of the tunneling oxide layer 110 and the blocking insulating layer 150, may be increased. Thus, when metal silicate such as, for example, hafnium silicate obtains crystallization of the cubic system or tetragonal system, the metal silicate may have a relatively high dielectric constant. In this regard, when the blocking insulating layer 150 is formed of the metal silicate, an increased coupling ratio may be obtained under conditions of the same thickness.

Referring to FIG. 23, the insulating layer, in which a silicon oxide layer is formed on and below a hafnium silicate layer, is measured in terms of voltage shift under a constant current stress according to an annealing temperature condition (850° C., 950° C. and 1050° C.). As illustrated in FIG. 23, a reduction in voltage shift as a function of time decreases as an annealing temperature is increased. In this regard, an increase in leakage current under stress conditions may be minimized. Accordingly, as an annealing temperature is increased, crystallization of the cubic system or tetragonal system may be further hardened.

Figure 24:
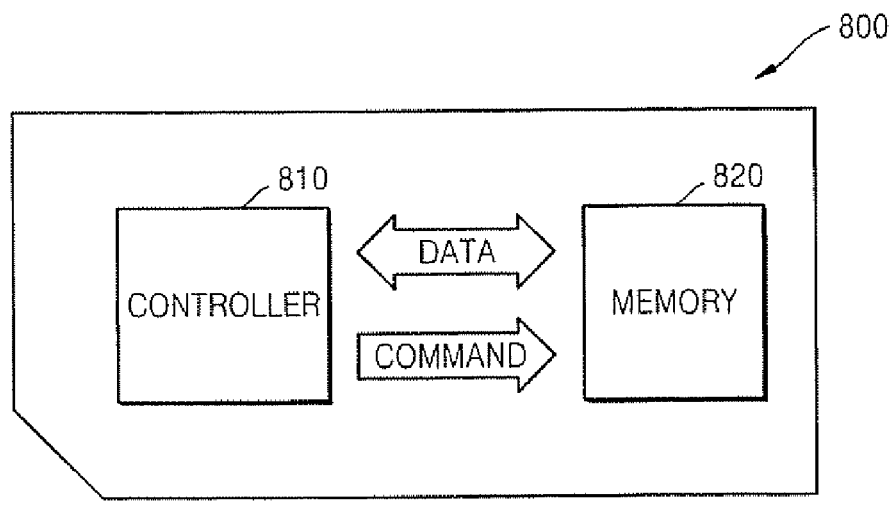
FIG. 24 is a schematic view of a card, according to some embodiments of the present invention.

Reference is now made to FIG. 24, which is a schematic view of a card 800, according to some embodiments of the present invention. In some embodiments, a controller 810 and a memory 820 may be arranged so as to exchange electrical signals. For example, according to a command of the controller 810, the memory 820 and the controller 810 may exchange data. Some embodiments provide that the card 800 may store data in the memory 820 and/or may output data from the memory 820 to the outside.

In some embodiments, the memory 820 may include a memory device such as the semiconductor device 1 or 2 of FIGS. 1, 4 through 13 or 18 through 21. Some embodiments provide that the memory device may include any memory device, for example, a dynamic random access memory (DRAM), a static random access memory (SRAM), a flash memory, and/or a phase change RAM (PRAM), among others. Some embodiments provide that the card 800 may be used in various portable electric apparatuses, and may be, for example, a multi media card (MMC) or a secure digital card (SD), among others.

Figure 25:
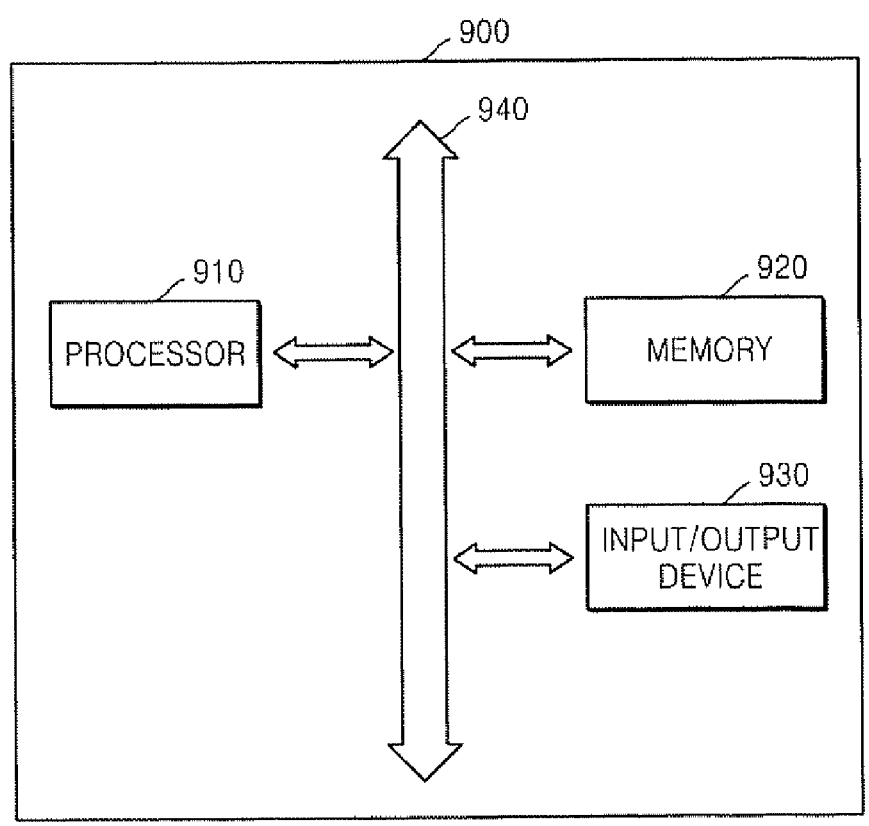
FIG. 25 is a block diagram of a system, according to some embodiments of the present invention.

Reference is now made to FIG. 25, which is a block diagram of system 900 according to some embodiments of the present invention. In some embodiments, a processor 910, an input/output device 930 and a memory 920 may perform data communication with each other via a bus 940. Some embodiments provide that the processor 910 executes a program and controls the system 900. The input/output device 930 may be used to input or output data of the system 900. In some embodiments, the system 900 is connected to an external apparatus, e.g., a personal computer and/or a network, via the input/output device 930, so as to exchange data therebetween.

Some embodiments provide that the memory 920 may store a code and data for an operation of the processor 910. The memory 920 may include a memory device such as the semiconductor device 1 or 2 of FIGS. 1, 4 through 13 or 18 through 21. In some embodiments, the memory device may include any memory device, for example, a DRAM, an SRAM, a flash memory device, and/or a PRAM, among others. For example, some embodiments provide that the system 900 may be used in various portable apparatuses such as a mobile phone, an MP3 player, a navigator, a solid state disk (SSD) and/or household appliances, among others.

Although the present invention has been described in terms of specific embodiments, the present invention is not intended to be limited by the embodiments described herein. Thus, the scope may be determined by the following claims.

What is claimed is:

1. A semiconductor device comprising:
   a semiconductor substrate including an active region;
   a transistor that is formed in the active region of the semiconductor substrate;
   an interlevel insulating layer that is formed on the semiconductor substrate;
   a contact plug that is formed in the interlevel insulating layer and that is electrically connected to the transistor;
   a lower electrode that is formed on the interlevel insulating layer and that is electrically connected to the contact plug;
   an upper electrode that is formed on the lower electrode; and
   an insulating layer of a cubic system or a tetragonal system comprising a metal silicate layer, the insulating layer formed between the lower electrode and the upper electrode,
   wherein the metal silicate layer comprises a first hafnium silicate layer, and a second hafnium silicate layer,
   wherein the insulating layer of the cubic system or the tetragonal system further comprises a zirconium-based oxide layer, and
   wherein the zirconium-based oxide layer is formed between the first hafnium silicate layer and the second hafnium silicate layer.

2. The semiconductor device of claim 1, wherein the zirconium-based oxide layer comprises a zirconium oxide layer or a zirconium silicate layer.

3. A semiconductor device comprising:
   a semiconductor substrate including an active region;
   a transistor that is formed in the active region of the semiconductor substrate;
   an interlevel insulating layer that is formed on the semiconductor substrate;

a contact plug that is formed in the interlevel insulating layer and that is electrically connected to the transistor;

a lower electrode that is formed on the interlevel insulating layer and that is electrically connected to the contact plug;

an upper electrode that is formed on the lower electrode; and an insulating layer of a cubic system or a tetragonal system comprising a metal silicate layer, the insulating layer formed between the lower electrode and the upper electrode, wherein the insulating layer further comprises a zirconium-based oxide layer, and wherein the insulating layer comprises the metal silicate layer and the zirconium-based oxide layer that are sequentially and alternately formed in at least two cycles.

4. A semiconductor device comprising:

a semiconductor substrate including an active region;

a transistor that is formed in the active region of the semiconductor substrate;

an interlevel insulating layer that is formed on the semiconductor substrate;

a contact plug that is formed in the interlevel insulating layer and that is electrically connected to the transistor;

a lower electrode that is formed on the interlevel insulating layer and that is electrically connected to the contact plug;

an upper electrode that is formed on the lower electrode; and an insulating layer of a cubic system or a tetragonal system comprising a metal silicate layer, the insulating layer formed between the lower electrode and the upper electrode, wherein the metal silicate layer comprises a first hafnium silicate layer including a first silicon concentration and a second hafnium silicate layer including a second silicon concentration that is greater than the first silicon concentration.

5. A semiconductor device comprising:

a semiconductor substrate;

an electrode layer formed on the semiconductor substrate; and a blocking oxide layer including an insulating layer of a cubic system or a tetragonal system, the blocking oxide layer formed between the semiconductor substrate and the electrode layer, and the insulating layer of the cubic system or the tetragonal system comprising a metal silicate layer, wherein the insulating layer of the cubic system or the tetragonal system comprises a multilayer insulating layer including at least two hafnium silicate layers and a zirconium-based oxide layer, and wherein the zirconium-based oxide layer is formed between two adjacent hafnium silicate layers of the at least two hafnium silicate layers.

6. The semiconductor device of claim 5, wherein the zirconium-based oxide layer comprises a zirconium oxide layer or a zirconium silicate layer.

7. The semiconductor device of claim 5, wherein the blocking oxide layer further comprises a silicon oxide layer disposed between the insulating layer of the cubic system or the tetragonal system and the semiconductor substrate.

8. The semiconductor device of claim 5, wherein the blocking oxide layer further comprises a silicon oxide layer disposed between the insulating layer of the cubic system or the tetragonal system and the electrode layer.

* * * * *